(12) United States Patent
Kawaguchi et al.

(10) Patent No.: US 8,170,072 B2
(45) Date of Patent: May 1, 2012

(54) LASER ANNEALING METHOD AND APPARATUS

(75) Inventors: Norihito Kawaguchi, Tokyo (JP);
Ryusuke Kawakami, Tokyo (JP);
Kenichiro Nishida, Tokyo (JP); Miyuki Masaki, Tokyo (JP); Masaru Morita, Tokyo (JP)

(73) Assignee: IHI Corporation, Tokyo (JP)

( * ) Notice: Subject to any disclaimer, the term of this patent is extended or adjusted under 35 U.S.C. 154(b) by 0 days.

(21) Appl. No.: 12/811,818

(22) PCT Filed: May 30, 2008

(86) PCT No.: PCT/JP2008/060044
§ 371 (c)(1),
(2), (4) Date: Sep. 29, 2010

(87) PCT Pub. No.: WO2009/087784
PCT Pub. Date: Jul. 16, 2009

(65) Prior Publication Data
US 2011/0008973 A1    Jan. 13, 2011

(30) Foreign Application Priority Data

Jan. 7, 2008   (JP) .................................. 2008-000347

(51) Int. Cl.
*H01S 3/10* (2006.01)
(52) U.S. Cl. .................. 372/9; 372/24; 372/27; 372/92; 372/98; 372/101; 372/107; 438/662; 438/663
(58) Field of Classification Search ............... 372/9, 24, 372/27, 92, 98, 101, 107; 438/662, 663; 29/25.01
See application file for complete search history.

(56) References Cited

U.S. PATENT DOCUMENTS

| 5,727,009 A | * | 3/1998 | Tajiri et al. ................. 372/50.11 |
| 6,172,820 B1 | | 1/2001 | Kuwahara |
| 2003/0034093 A1 | | 2/2003 | Morris et al. |

(Continued)

FOREIGN PATENT DOCUMENTS

JP         5-41006 A      2/1993

(Continued)

OTHER PUBLICATIONS

International Search Report issued in corresponding application PCT/JP2008/060044, completed Aug. 20, 2008, mailed Sep. 2, 2008.

(Continued)

*Primary Examiner* — Michelle Mandala
(74) *Attorney, Agent, or Firm* — Griffin & Szipl, P.C.

(57) ABSTRACT

In the case of a lens array type homogenizer optical system, the incident angle and intensity of a laser beam 1 entering a large-sized lens (long-axis condenser lens 22) of a long-axis condensing optical system, which is provided on the rear side, are changed for every shot by performing laser irradiation while long-axis lens arrays 20a and 20b are reciprocated in a direction corresponding to a long axial direction of a linear beam (X-direction). Therefore, vertical stripes are significantly reduced. Further, the incident angle and intensity of a laser beam 1 entering a large-sized lens (projection lens 30) of a short-axis condensing optical system, which is provided on the rear side, are changed for every shot by performing laser irradiation while short-axis lens arrays 26a and 26b are reciprocated in a direction corresponding to a short axial direction of a linear beam (Y-direction). Therefore, horizontal stripes are significantly reduced.

6 Claims, 7 Drawing Sheets

U.S. PATENT DOCUMENTS

| | | | |
|---|---|---|---|
| 2004/0241923 A1* | 12/2004 | Toida | 438/166 |
| 2005/0031261 A1* | 2/2005 | Tanaka | 385/31 |
| 2005/0056626 A1 | 3/2005 | Gross et al. | |
| 2007/0045575 A1 | 3/2007 | Bruland | |
| 2009/0218475 A1 | 9/2009 | Kawakami et al. | |

FOREIGN PATENT DOCUMENTS

| | | | |
|---|---|---|---|
| JP | 10-242073 A | 9/1998 |
| JP | 2835924 B2 | 10/1998 |
| JP | 10-294288 A | 11/1998 |
| JP | 10-333077 A | 12/1998 |
| JP | 11-023952 | 1/1999 |
| JP | 11-058053 | 3/1999 |
| JP | 11-214306 A | 8/1999 |
| JP | 2000338447 A | 12/2000 |
| JP | 2000349041 A | 12/2000 |
| JP | 2001-68430 A | 3/2001 |
| JP | 3191702 B2 | 5/2001 |
| JP | 3204307 A | 9/2001 |
| JP | 2003-124136 A | 4/2003 |
| JP | 2003-282477 A | 10/2003 |
| JP | 3502981 B2 | 12/2003 |
| JP | 2005-109460 A | 4/2005 |
| JP | 2005109460 | 4/2005 |
| JP | 2006-32843 A | 2/2006 |
| JP | 2006-49635 A | 2/2006 |
| JP | 2006-119210 A | 5/2006 |
| JP | 2006-287183 A | 10/2006 |
| JP | 2006287183 | 10/2006 |
| JP | 2007-214527 A | 8/2007 |
| JP | 2007214527 | 8/2007 |
| JP | 2008-130713 A | 6/2008 |
| JP | 2008-159836 A | 7/2008 |

OTHER PUBLICATIONS

K. Nishida et al., "Performance of Polycrystallization with High Power Solid Green Laser," AM-FPD, 2006.

T. Okamoto et al., "Development of Green Laser Annealing Optical System for Low-Temperature Polysilicon," RTM-05-28, pp. 15-22.

International Search Report issued in International Appl. No. PCT/JP2008/060749, of co-pending U.S. Appl. No. 12/977,543, completed Aug. 18, 2008, mailed Aug. 26, 2008.

Office Action issued in related Korean Patent Application No. 10-2010-7012710, dated Jul. 29, 2011.

Office Action issued in related Chinese Patent Application No. 200880124168.6, dated Aug. 15, 2011.

Office Action issued in related German Patent Application No. 102008047611.0 on Sep. 22, 2011.

Office Action issued in related German Patent Application No. 102008029622.8 on Sep. 26, 2011.

Notice of Allowance dated Oct. 13, 2011 in co-pending U.S. Appl. No. 12/977,543.

* cited by examiner

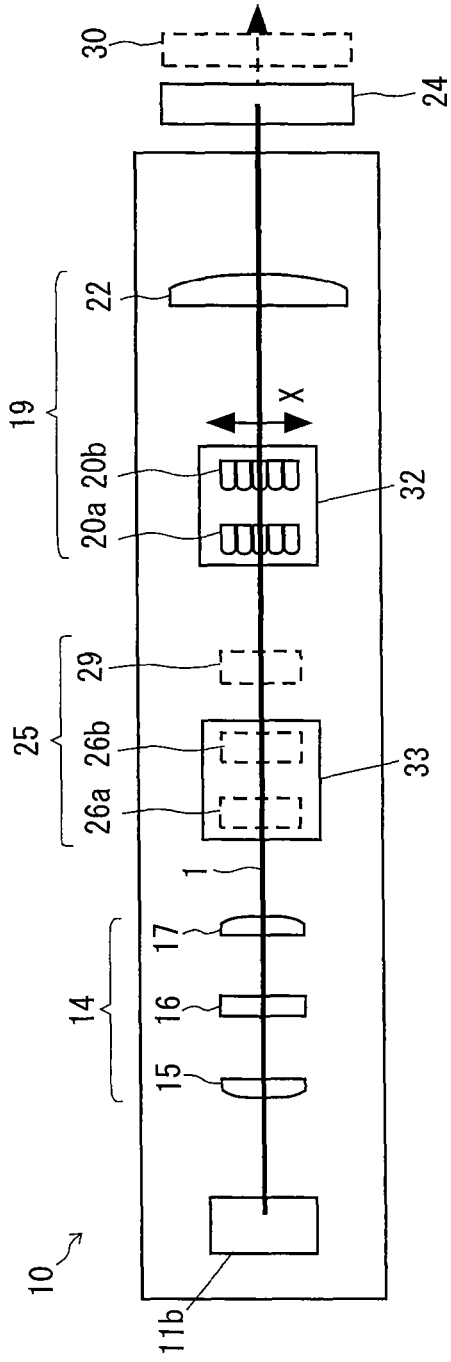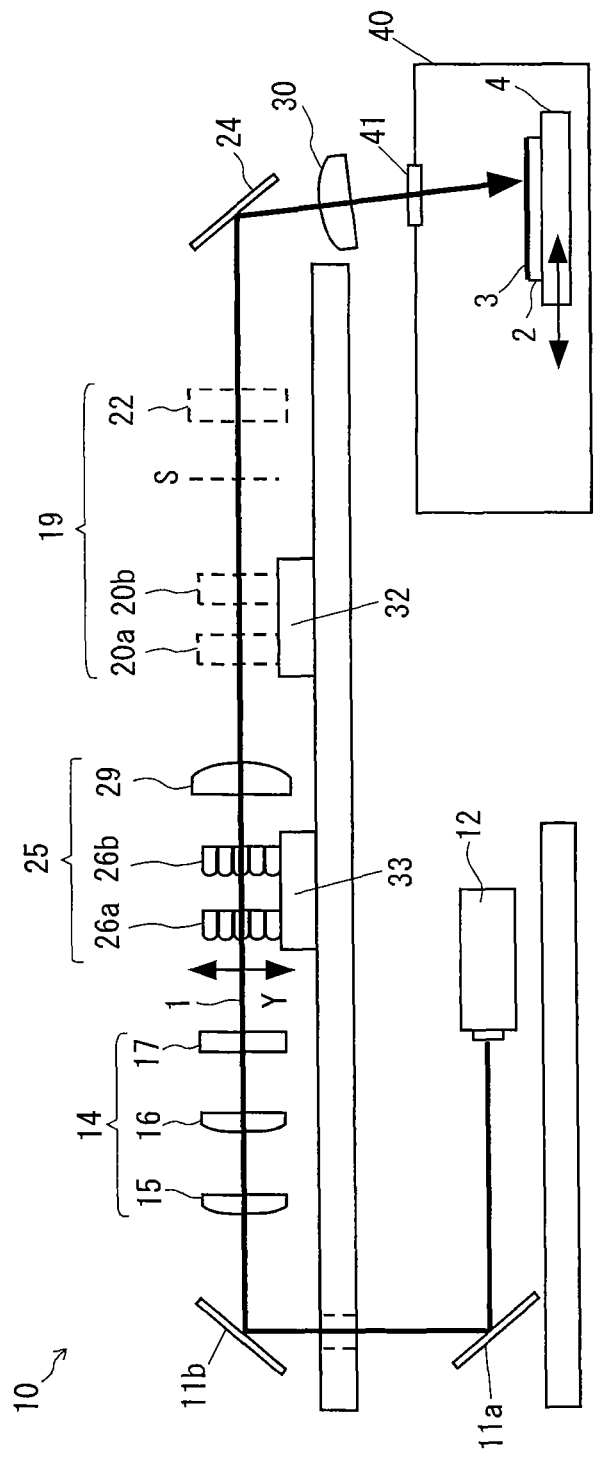

WITHOUT RECIPROCATION

WITH RECIPROCATION

Fig.5
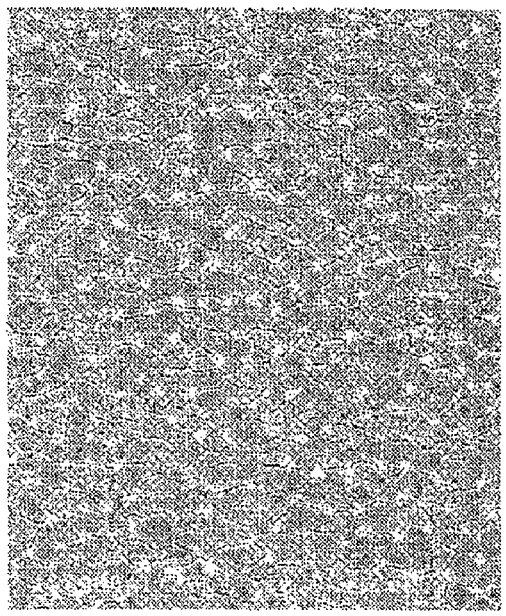 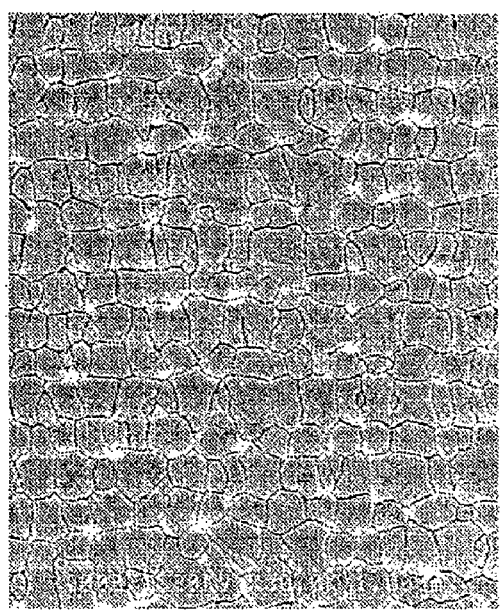
P POLARIZATION    S POLARIZATION

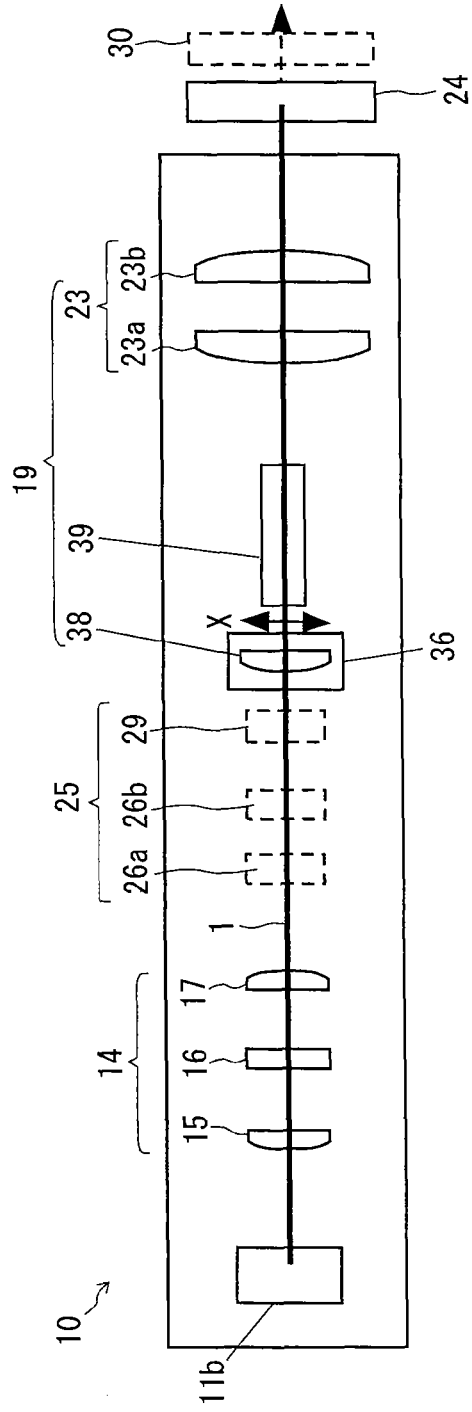
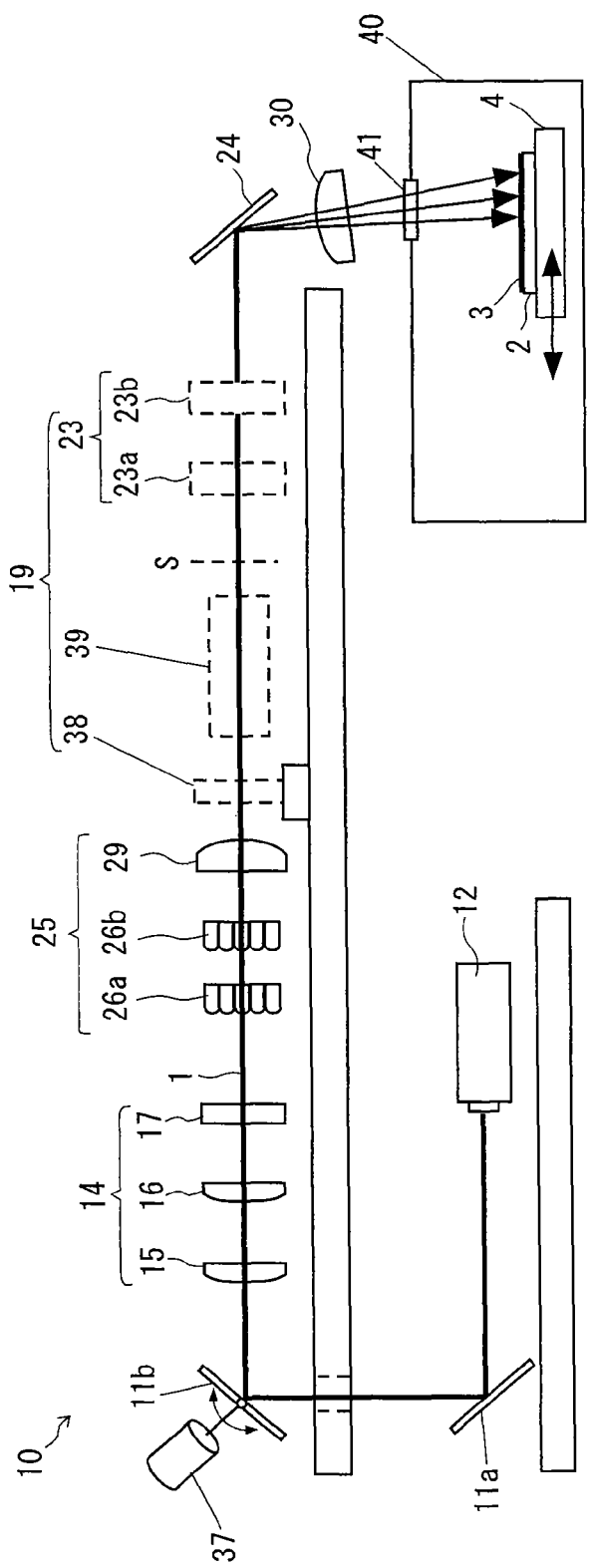
Fig.7A
Fig.7B

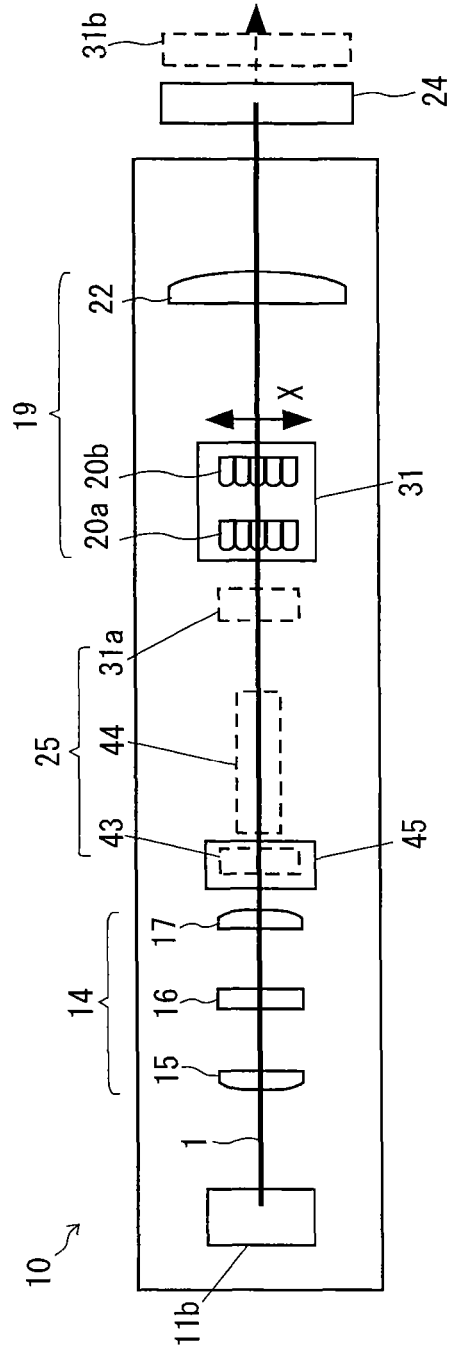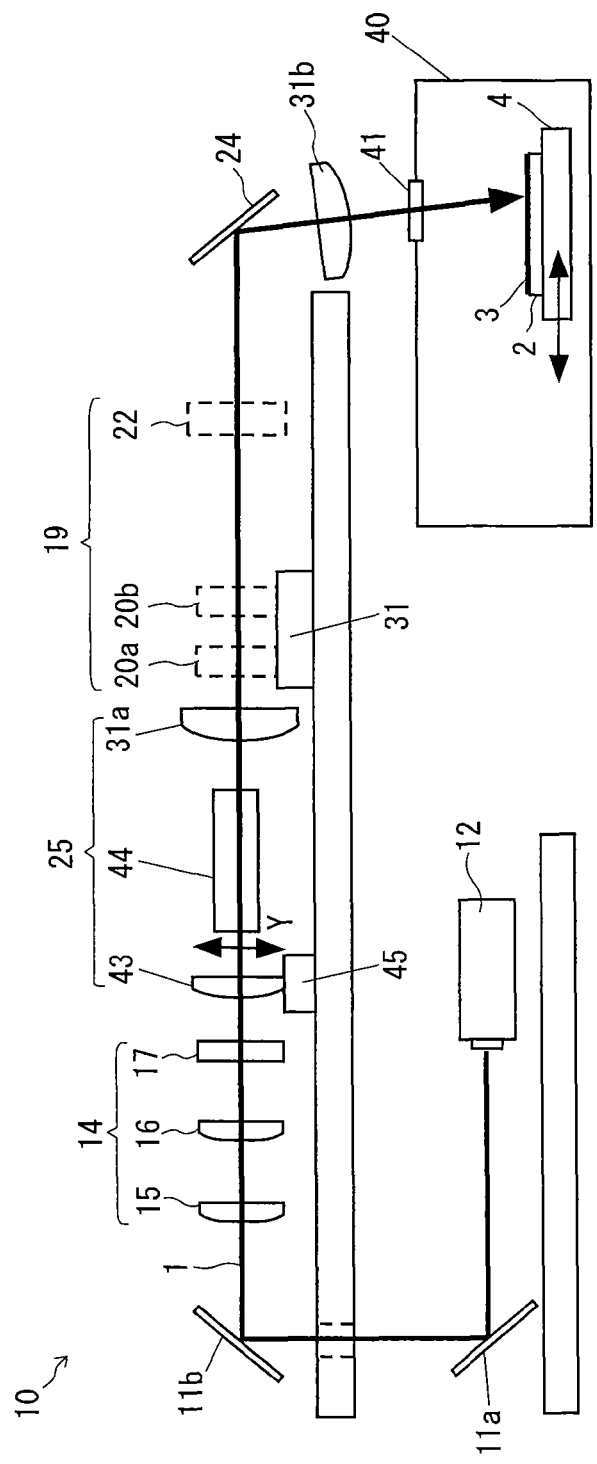

LASER ANNEALING METHOD AND APPARATUS

This is a National Phase Application in the United States of International Patent Application No. PCT/JP2008/060044 filed May 30, 2008, which claims priority on Japanese Patent Application No. 2008-000347, filed Jan. 7, 2008. The entire disclosures of the above patent applications are hereby incorporated by reference.

BACKGROUND OF THE INVENTION

1. Field of the Invention

The present invention relates to a laser annealing method and apparatus that anneal the surface of an object to be irradiated by laser irradiation.

2. Description of the Related Art

In recent years, a high-performance thin film transistor has been fabricated by the laser annealing to an amorphous semiconductor film or a crystalline semiconductor film that is formed on an insulated substrate such as a glass substrate. A glass substrate is inexpensive and excellent in terms of machining property as compared to a quartz substrate that has been commonly used in the past. For this reason, the glass substrate has an advantage of being formed to have a large area. The reason to use laser in crystallizing a semiconductor film is that a melting point of a glass substrate is 600° C. or less but it is possible to melt and crystallize a semiconductor film without heating the glass substrate if using laser.

Since a crystalline silicon film formed by using laser annealing having high mobility, a thin film transistors for driving pixels and a TFT for a drive circuit may be fabricated on one glass substrate. The crystalline silicon TFTs are used in a liquid crystal display of a portable or digital still camera, and has been widely provided as a product.

Currently, a laser annealing apparatus shapes a pulsed laser beam, which is generated from a source of laser such as excimer laser or solid-state laser, into a linear beam that has a profile of, for example, 100 to 400 mm×0.05 to 0.5 mm; irradiates the amorphous silicon film, which is deposited on the glass substrate, with the linear beam; and melts and solidifies the silicon film in order to crystallize the silicon film. If the glass substrate is transferred, it is possible to irradiate the entire surface of the silicon film deposited on the glass substrate which is the size of, for example, 730×920 mm from amorphous silicon to crystalline silicon.

A laser annealing method using the linear beam has some problems, and a particularly serious problem is that visible stripes appear in a direction perpendicular to a long axial direction of the linear beam and in a direction parallel to the long axial direction. Hereinafter, stripes perpendicular to the long axial direction of the linear beam are called as "vertical stripes", and stripes parallel to the long axial direction are called as "horizontal stripes". Further, the vertical stripes and the horizontal stripes are collectively called as "irradiated stripes".

FIGS. 1a and 1b of the following Patent Document show a state where the irradiated stripes appear on the film. If an active matrix type liquid crystal display or organic EL display is manufactured using the film having the irradiated stripes, there is a disadvantage in that the same stripes as the irradiated stripes appear on a picture of the display. In particular, since the organic EL display is more sensitive to the irradiated stripes than the liquid crystal display, there is a demand for a countermeasure that is effective to reduce the irradiated stripes.

Some methods of reducing irradiated stripes are proposed in the following Patent Documents 1 to 4. The uniformity of the beam, interference, the deviation of laser shots, the change of the profile of laser, and the like have been mentioned as factors generating the irradiated stripes, but have not been clarified.

[Patent Document 1]
Japanese Unexamined Patent Application Publication No. 10-294288

[Patent Document 2]
Japanese Unexamined Patent Application Publication No. 2001-68430

[Patent Document 3]
Japanese Unexamined Patent Application Publication No. 10-242073

[Patent Document 4]
Japanese Examined Patent Application Publication No. 5-41006

The present inventors came to specify factors generating the irradiated stripes after a process of trial and error for clarifying the cause of the irradiated stripes.

First, the present inventors investigated the pattern of vertical stripes when the position of a lens array was shifted by 1 mm in a direction corresponding to a long axial direction of a linear beam in a homogenizer for homogenizing the light intensity in the long axial direction of the linear beam. As a result, the pattern of the vertical stripes was changed. The reason for the change was considered as follows:

(a) the vertical stripes appeared depending on the profile of a laser beam emitted from a laser source, or (b) the vertical stripes appeared due to scattered light generated on the surface of a lens of the homogenizer.

Then, in order to determine which is right, the present inventors made two kinds of laser beams enter the same homogenizer optical system, and investigated vertical stripes. In general, the light intensity profile of laser is an intrinsic property of an each laser oscillator. Therefore, if the pattern of the vertical stripes is different, it may be determined that the irradiated stripes depend on the profile of a laser beam. However, as a result of the investigation, the same pattern of the vertical stripes appeared. From this result, it was determined that the irradiated stripes were caused by the scattered light generated on the surface of the lens. That is, it could be concluded as follows: since a laser beam was scattered on the surface of the leans and the uniformity of the laser beam thus deteriorated on the irradiated surface, the irradiated stripes appeared.

In general, the surface accuracy of a lens is $\lambda/4$ or $\lambda/10$. However, a lens used in laser annealing, particularly, a lens provided on the rear side is a large-sized lens having a length of 100 mm or more. Accordingly, since it is difficult to work the lens and to measure the surface accuracy of the lens, the surface accuracy of the lens significantly deteriorates and may be $\lambda$ or more. According to the current technology, since there is a limit to the machining accuracy of a large-sized lens, it is difficult to further improve the surface accuracy. For this reason, other countermeasures should be taken to improve the surface accuracy.

SUMMARY OF THE INVENTION

The present invention has been made in consideration of the above-mentioned problems, and an object of the present invention is to provide a laser annealing method and apparatus capable of significantly reducing the appearance of irradiated stripes accompanied with the deterioration of the uniformity of a homogenized linear beam on an irradiated surface that is caused by scattered light generated on the surface of a lens.

A method, which temporally changes an angle of a laser beam entering a lens without shifting the linear beam toward long beam direction on the irradiated surface, has been made the close investigation of a method of reducing the deterioration of the uniformity of a line beam that is caused by scattered light generated on the surface of a lens. That is, the method changes the direction of scattered light to be generated on the surface of a lens by temporally changing an angle of a laser beam entering a lens, and removes visible stripes by temporally changing the uniformity of the beam on the irradiated surface that is caused by scattered light. Since the laser beam is irradiated so as to overlap each other in a short axial direction of a linear beam, the uniformity of the linear beam is changed for every shot. Therefore, it is possible to obtain an effect of dispersing stripes, so that the stripes are visually significantly reduced. As a result, when an overlap ratio is, for example, 90% or more, the laser irradiation is performed so that stripes are not seen.

Specifically, an embodiment of the present invention includes the followings in order to reduce vertical stripes.

In a lens array type homogenizer optical system, the incident angle and intensity of a laser beam entering a large-sized lens of a long-axis condensing optical system, which is provided on the rear side, are changed for every shot by performing laser irradiation while long-axis lens arrays are reciprocated in a direction corresponding to a long axial direction of a linear beam. Therefore, the uniformity of a beam in the long axial direction on the surface to be irradiated is changed for every shot, so that it is possible to obtain an effect of dispersing vertical stripes on the surface to be irradiated that are caused by scattered light generated on the surface of a lens and vertical stripes are visually significantly reduced. Further, if a relationship of "$P/3 \leqq S < W$", "$P/2 \leqq S < W$", or "$P \leqq S < W$" is satisfied when a moving width of the reciprocation of each of the long-axis lens arrays is represented by S; a pitch of stripes, which are parallel to a scanning direction of the linear beam and appear visually when laser annealing is performed without reciprocating the long-axis lens arrays, is represented by P; and a width of each cylindrical lens of the long-axis lens arrays is represented by W, the energy distribution nonuniformity causing the vertical stripes is adequately deviated in a direction (horizontal direction in FIG. 2) perpendicular to a substrate transfer direction. As a result, the vertical stripes are properly dispersed, so that the occurrence of the visible vertical stripes can be effectively reduced. Alternatively, a relationship of "$1.0 \text{ mm} \leqq S < W$", "$1.5 \text{ mm} \leqq S < W$", or "$3.0 \text{ mm} \leqq S < W$" may be satisfied.

Further, in a lens array type homogenizer optical system, the incident angle and intensity of a laser beam entering a large-sized lens of a long-axis condensing optical system, which is set on the rear side of optical system, are changed for every shot while a distance on an optical path between the long-axis condensing optical system and the surface of a film to be irradiated is maintained constant and the relative distances on the optical path between the long-axis condensing optical system and long-axis lens arrays are increased or decreased. Therefore, vertical stripes are significantly reduced. In this case, it is possible to easily increase or decrease the relative distances on the optical path between the long-axis condensing optical system and the long-axis lens arrays by reciprocating the long-axis lens arrays, which are formed in a small size, in an optical axis direction.

Furthermore, in the case of a waveguide type homogenizer optical system, the incident angle and intensity of a laser beam entering a large-sized lens of a long-axis condensing optical system, which is provided on the rear side, are changed for every shot while long-axis focusing lens are reciprocated in a direction corresponding to a long axial direction of a linear beam. Therefore, vertical stripes are significantly reduced.

Another embodiment of the present invention includes the followings in order to reduce horizontal stripes.

In a lens array type homogenizer optical system, the incident angle and intensity of a laser beam entering a large-sized lens of a short-axis condensing optical system, which is set on the rear side of optical system, are changed for every shot while short-axis lens arrays are reciprocated in a direction corresponding to a short axial direction of a linear beam. Therefore, the uniformity of a beam in the short axial direction on the surface to be irradiated is changed for every shot, so that it is possible to obtain an effect of dispersing horizontal stripes on the surface to be irradiated that are caused by scattered light generated on the surface of a lens and horizontal stripes are visually significantly reduced.

In the case of a lens array type homogenizer optical system, the incident angle and intensity of a laser beam entering a large-sized projection lens, which is set on the rear side of optical system, are changed for every shot also by performing laser irradiation while a short-axis condenser lens, which is set at the rear of short-axis lens arrays, is reciprocated in a direction corresponding to a short axial direction of a linear beam. Therefore, horizontal stripes are significantly reduced.

Further, the incident angle and intensity of a laser beam entering a large-sized projection lens, which is set on the rear side of optical system, are changed for every shot also by tilting a reflecting mirror, which is set on an optical path on the upstream side of a short-axis homogenizer, so that a linear beam is reciprocated in a short axial direction. Therefore, horizontal stripes are significantly reduced. In this case, the short-axis homogenizer may be any one of a lens array type homogenizer and a waveguide type homogenizer.

Furthermore, in the case of a waveguide type homogenizer optical system, the incident angle and intensity of a laser beam entering a large-sized lens of a condensing optical system, which is set on the rear side, are changed for every shot of optical system while short-axis focusing lens is reciprocated in a direction corresponding to a short axial direction of a linear beam. Therefore, horizontal stripes are significantly reduced.

In addition, the polarization direction of the laser beam may correspond to S polarization with respect to the surface of the film to be irradiated. When an amorphous semiconductor film is annealed by an S-polarized laser beam, a polycrystalline semiconductor film, which has uniform crystal grains having grain size larger (coarser) than crystal grains of a polycrystalline semiconductor film annealed by a P-polarized laser beam, is obtained. For this reason, it is possible to obtain an effect of reducing visible stripes.

Therefore, according to the laser annealing method and apparatus of the present invention, it is possible to obtain an excellent effect of significantly reducing the occurrence of irradiated stripes accompanied with the deterioration of the uniformity of a linear beam on an irradiated surface that is caused by scattered light generated on the surface of a lens.

BRIEF DESCRIPTION OF THE DRAWINGS

FIG. 1A is a view showing the schematic structure of a laser annealing apparatus according to a first embodiment of the present invention.

FIG. 1B is another view showing the schematic structure of the laser annealing apparatus according to the first embodiment of the present invention.

FIG. 5 is a SEM photograph showing the difference of crystal grains depending on polarization.

FIG. 7A is a schematic view showing the structure of a laser annealing apparatus according to a third embodiment of the present invention.

FIG. 7B is another schematic view showing the structure of the laser annealing apparatus according to the third embodiment of the present invention.

FIG. 8A is a schematic view showing the structure of a laser annealing apparatus according to a fourth embodiment of the present invention.

FIG. 8B is another schematic view showing the structure of the laser annealing apparatus according to the fourth embodiment of the present invention.

DESCRIPTION OF THE PREFERRED EMBODIMENTS

Figure 2:
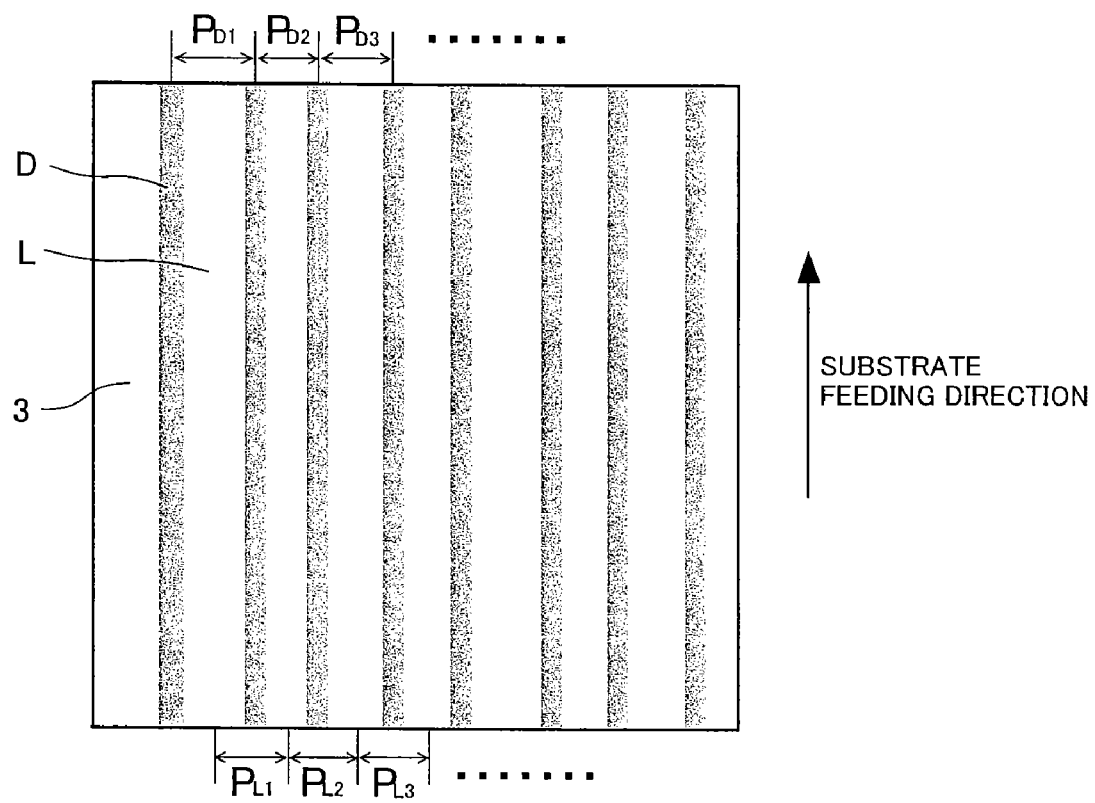
FIG. 2 is a view illustrating a pitch P of vertical stripes.

Preferred embodiments of the present invention will be described below with reference to the accompanying drawings. Same reference numerals are given to common portions in each of the drawings to avoid redundant descriptions.

First Embodiment

FIGS. 1A and 1B show the schematic structure of a laser annealing apparatus 10 according to a first embodiment of the present invention. FIG. 1A is a plan view, and FIG. 1B is a side view. Further, an optical system, which acts only in a short axial direction of a linear beam, is shown by a phantom line (broken line) in FIG. 1A. An optical system, which acts only in a long axial direction of a linear beam, is shown by a phantom line in FIG. 1B.

The laser annealing apparatus 10 is that shapes a laser beam 1 generated by laser oscillation in order to condense the laser beam into a linear beam on the surface of an object 3 to be irradiated, relatively scans the object 3 to be irradiated with the linear beam in a short axial direction of the linear beam so that the irradiation of the laser beam 1 overlaps each other, and anneals the surface of the object 3 to be irradiated by laser irradiation. Meanwhile, the vertical direction indicates a long axial direction of the linear beam in FIG. 1A, and the horizontal direction on the surface to be irradiated indicates a short axial direction of the linear beam in FIG. 1B.

The laser annealing apparatus 10 will be described in more detail below.

The laser beam 1 emits from a laser source 12 at a pulse frequency of, for example, 2 to 4 kHz. The type of the laser source 12 is not particularly limited. An excimer laser, a YAG laser, a YLF laser, a YVO$_4$ laser, a glass laser, a semiconductor laser, a CO$_2$ laser, or the like may be used as the laser beam. In particular, a solid-state laser, such as a YAG laser, a YLF laser, or a YVO$_4$ laser, makes it possible to utilize laser energy, which has high reliability and stability, at high efficiency. Further, since a silicon film has a high absorption coefficient in a visible light region of 330 to 800 nm, but wavelength of the YAG laser, the YLF laser, the YVO$_4$ laser, or the glass laser may be one converted by the second or third harmonic generator.

The laser beam 1, which emits from the laser source 12 by pulse oscillation, is sequentially reflected by reflecting mirrors 11a and 11b. Then, the diameter of the laser beam is enlarged by a beam expander 14. The beam expander 14 shown as one structural example includes a convex spherical lens 15, a short-axis cylindrical lens 16 that has a curvature plane in a short axial direction, and a long-axis cylindrical lens 17 that has a curvature plane in a long axial direction. In the beam expander 14 having the above-mentioned structure, it is possible to separately set an enlargement ratio in the long axial direction and the short axial direction. The beam expander 14 may have other structure. For example, the beam expander may have structure where a concave spherical lens and a convex spherical lens are combined with each other.

The light intensity distribution of the laser beam 1, of which diameter is enlarged by the beam expander 14, in the long axial direction of the linear beam is homogenized by a long-axis homogenizer 19 on the surface to be irradiated, and the light intensity distribution thereof in the short axial direction of the linear beam is homogenized by a short-axis homogenizer 25 on the surface to be irradiated.

As shown in FIG. 1A, the long-axis homogenizer 19 includes a long-axis lens arrays 20a and 20b and a long-axis condenser lens 22 used as a long-axis condensing optical system. The long-axis lens arrays divide an incident laser beam 1 into plural beams in a direction corresponding to the long axial direction of the linear beam. The long-axis condensing optical system makes the laser beam 1, which is divided into the plural beams in the long axial direction, condense each other in the long axial direction on the surface of the film 3 to be irradiated.

In the long-axis homogenizer 19 having the above-mentioned structure, the laser beam 1 enlarged by the beam expander 14 is divided into plural beams in the long axial direction by the long-axis lens arrays 20a and 20b. The laser beam 1, which passes through the long-axis lens arrays 20a and 20b and is divided into the beams, forms an image on the surface of the film 3 to be irradiated, which is formed on a substrate 2, as an rectangular beam elongated in the long axial direction by the long-axis condenser lens 22. Meanwhile, a vertical reflecting mirror 24 is disposed on an optical path between the long-axis condenser lens 22 and the substrate 2 so that light emitted from the long-axis condenser lens 22 is reflected toward the substrate 2.

The length of the rectangular beam, which is irradiated onto the substrate 2, in the long axial direction may be, for example, several tens mm.

In this embodiment, two long-axis lens arrays 20a and 20b are disposed with a distance therebetween in an optical axis direction. A composite focal length of the long-axis lens arrays 20a and 20b is determined by the focal lengths of the lens arrays 20a and 20b and a distance of each of the lens arrays in the optical axis direction. Further, a factor, which is used to determine the length of the linear beam in the long axial direction, includes the composite focal length of the long-axis lens arrays 20a and 20b. Accordingly, if the laser annealing apparatus is formed to have the structure where the distance of each of the lens arrays 20a and 20b in the optical axis direction can be changed, it is possible to change the length of the linear beam in the long axial direction by changing the composite focal length according to need. However, only one long-axis lens array may be used in the present invention.

The short-axis homogenizer 25 includes short-axis lens arrays 26a and 26b and a short-axis condensing optical system (29 and 30). The short-axis lens arrays divide an incident laser beam 1 into plural beams in the short axial direction. The short-axis condensing optical system makes the laser beam 1, which is divided into the plural beams by the short-axis lens arrays 26a and 26b, overlap each other in the short axial direction on the surface of the film 3 to be irradiated. The short-axis condensing optical system of this embodiment includes a short-axis condenser lens 29 and a projection lens 30. The short-axis condenser lens makes the laser beam 1, which is divided into plural beams by the short-axis lens arrays 26a and 26b, condense each other on an image plane S in the short axial direction. The projection lens decreases the short-axis image of an image plane S at a predetermined ratio, and projects the short-axis image onto the surface of the object 3 to be irradiated.

In the short-axis homogenizer 25 having the above-mentioned structure, the laser beam 1 enlarged by the beam expander 14 is divided into plural beams in the short axial direction by the short-axis lens arrays 26a and 26b. The laser beam 1, which passes through the short-axis lens arrays 26a and 26b and is divided into the beams, is condensed in the short axial direction by the short-axis condenser lens 29 and then forms an image on the image plane S. Subsequently, after the laser beam is reflected toward the substrate 2 by the vertical reflecting mirror 24, the short-axis image formed on the image plane S is decreased in the short axial direction at a predetermined ratio and then projected onto the surface of the object 3 to be irradiated that is formed on a substrate 2, by the projection lens 30. The length of the rectangular beam, which is irradiated onto the substrate 2, in the short axial direction may be, for example, several tens μm.

In this embodiment, two short-axis lens arrays 26a and 26b are disposed with a distance therebetween in an optical axis direction. Further, if the laser annealing apparatus is formed to have the structure where the distance of each of the short-axis lens arrays 26a and 26b in the optical axis direction can be changed, it is possible to change the width of the homogenized beam in the short axial direction by changing the composite focal length according to need. However, only one short-axis lens array may be used in the present invention.

The object 3 to be irradiated with the laser beam 1 is an amorphous semiconductor film, and is formed on the substrate 2 by a film deposited method such as a CVD method. An a-Si film or a compound semiconductor film (amorphous silicon-germanium film or the like) having amorphous structure is exemplified as the amorphous semiconductor film.

The substrate 2 is held by a substrate stage 4, and is transferred in the short axial direction of the linear beam. As the substrate stage 4 is moved, the film 3 to be irradiated, which is formed on the substrate 2, can be scanned in the short axial direction. The transferring speed of the substrate stage 4 is controlled so that the irradiation is performed several times per unit region of the surface to be irradiated, that is, the irradiation of the linear beam overlaps each other. For example, the irradiation is performed so that an overlap ratio becomes 90% or more. Meanwhile, the overlap ratio indicates a ratio of the moving distance of the substrate 2 for every laser shot to a flat region (half width in the case of a Gaussian shape) of the light intensity distribution in the short axial direction of the linear beam.

The substrate stage 4 of this embodiment is set in a processing chamber 40 of which atmosphere can be controlled to be vacuum or a non-oxidizing gas atmosphere. Since the atmosphere of the processing chamber 40 is controlled to be vacuum or a non-oxidizing gas atmosphere during annealing, the oxidation of the surface of the object 3 to be irradiated is prevented. Hydrogen or inert gas (nitrogen gas, argon gas, helium gas, neon gas, or the like) may be used as the non-oxidizing gas. Meanwhile, at the processing chamber 40 transmission window 41 through which the laser beam 1 is transmitted is put in.

Instead of the above-mentioned structure where the substrate 2 on which the film 3 to be irradiated is processed in the processing chamber 40, there may be used a method of blowing inert gas only on portions irradiated with the linear beam without using the processing chamber 40. This may also be applied to second to fourth embodiments to be described below.

As shown in FIG. 1A, the laser annealing apparatus 10 further includes a long-axis lens array moving apparatus 32 that reciprocates the long-axis lens arrays 20a and 20b in a direction corresponding to the long axial direction of the linear beam (X-direction in FIG. 1A) during the laser irradiation. The long-axis lens array moving apparatus 32 is automatically controlled by a control unit (not shown).

The incident angle and intensity of the laser beam 1 entering a large-sized lens (the long-axis condenser lens 22 in this embodiment) of the long-axis condensing optical system, which is set on the rear side of optical system, are changed for every shot while the long-axis lens arrays 20a and 20b are reciprocated in the direction corresponding to the long axial direction of the linear beam as described above. Therefore, the uniformity of the beam in the long axial direction on the surface to be irradiated is changed for every shot, so that it is possible to obtain an effect of dispersing vertical stripes on the surface to be irradiated that are caused by scattered light generated on the surface of the lens and vertical stripes are visually significantly reduced. As a result, when the overlap ratio is, for example, 90% or more, the laser irradiation is performed so that stripes are not seen.

A moving width of the reciprocation of each of the long-axis lens arrays 20a and 20b is represented by S; a pitch of the vertical stripes, which are parallel to the scanning direction of the linear beam (the transferring direction of the substrate 2 in this embodiment) and appear visually when laser annealing is performed without reciprocating the long-axis lens arrays 20a and 20b, is represented by P; and a width of each cylindrical lens 21 of the long-axis lens arrays 20a and 20b is represented by W. Preferable conditions of the moving width S and the width W will be described below.

FIG. 2 is a schematic diagram illustrating the pitch P of the vertical stripes. As shown in FIG. 2, the vertical stripes are composed of bright and dark parts L and D that appear alternately. Since FIG. 2 is a schematic diagram, boundaries between the bright parts L and the dark parts D are clearly shown in FIG. 2. However, in actual stripes, the bright and dark parts L and D gradates and appear alternately. Distances $P_{L1}, P_{L2}, P_{L3}$ ... between the centers of the bright parts L have deviation, and distances distance $P_{D1}, P_{D2}, P_{D3}$ ... between the centers of the dark parts D have deviation.

In this specification, the pitch P of the vertical stripes means any one of an average value $P_{LA}$ of the distances distance $P_{L1}, P_{L2}, P_{L3}$ ... between the centers of the bright parts L, an average value $P_{DA}$ of the distances distance $P_{D1}, P_{D2}$, $P_{D3}$... between the centers of the dark parts D, and an average value of the sum of $P_{LA}$ and $P_{D4}$.

Figure 3:
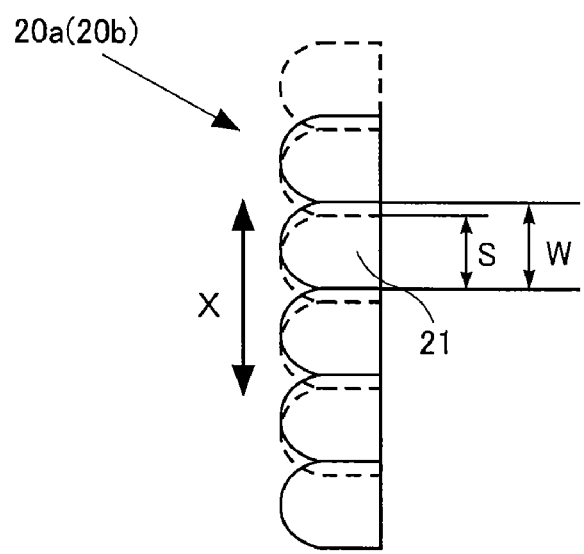
FIG. 3 is a view illustrating the moving width S of the reciprocation of each of long-axis cylindrical lens arrays and the width W of a cylindrical lens.

FIG. 3 is a view illustrating the moving width S of the reciprocation of each of the long-axis lens arrays 20a and 20b and the width W of the cylindrical lens 21.

As shown in FIG. 3, the moving width S of the reciprocation of each of the long-axis lens arrays 20a and 20b is a moving stroke of the cylindrical lens 21 in the X direction, and the width W of the cylindrical lens 21 is the width of the cylindrical lens in a reciprocating direction (X direction).

Considering that the non-uniformity of the energy distribution of the beam in the long axial direction, which causes vertical stripes, is dispersed by reciprocating the long-axis lens arrays 20a and 20b, the moving width S of the reciprocation of each of the long-axis lens arrays 20a and 20b may be at least P/3 or more. Further, the moving width S is preferably smaller than the width W of the cylindrical lens so that the moving stroke of each of the long-axis lens arrays 20a and 20b does not exceed the lens width W.

Accordingly, it is preferable that the moving width S and the lens width W be set so as to satisfy the condition of "P/3≦S<W". For this reason, the energy distribution causing the vertical stripes is deviated in a direction (horizontal direction in FIG. 2) perpendicular to a substrate transferring direction by a distance corresponding to at least ⅓ of the pitch P of the stripes. Therefore, it is possible to effectively reduce the occurrence of the visible vertical stripes by properly dispersing the vertical stripes. Further, if the condition is P/2≦S<W or P≦S<W, it is possible to further increase an effect of dispersing stripes. Therefore, it is possible to obtain a larger stripe-reducing effect.

Furthermore, it has been identified that the pitch P of the vertical stripes is set to about 3 to 4 mm. Therefore, in particular, the moving width S is preferably 1.0 mm or more, more preferably 1.5 mm or more, and most preferably 3.0 mm or more. Even in this case, it is preferable that a condition of "S<W" be satisfied.

Figure 4A:
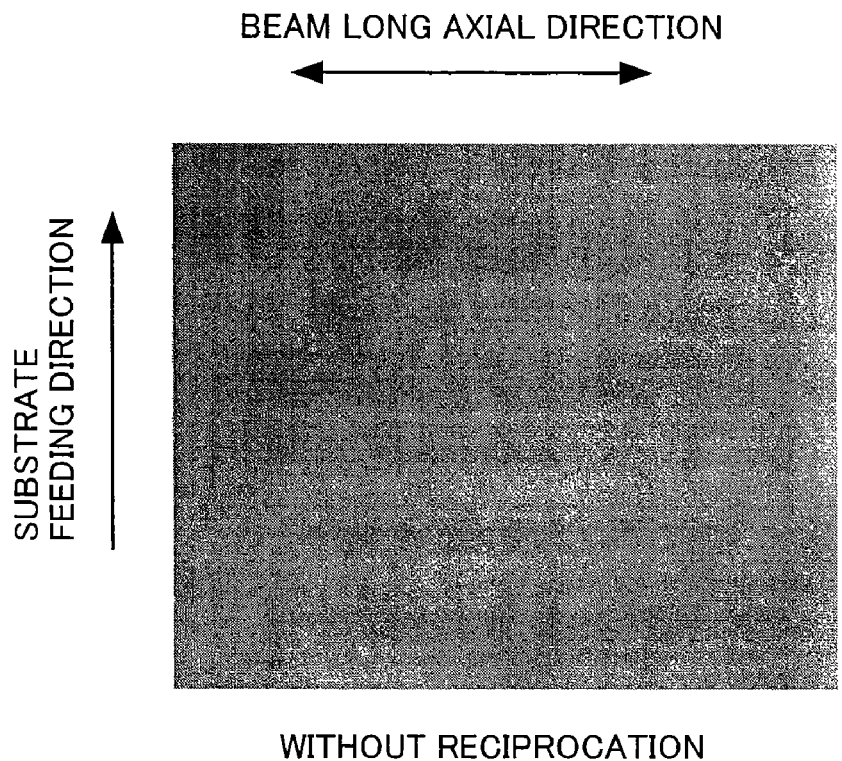
FIG. 4A is a photograph of a semiconductor film annealed by laser while the long-axis cylindrical lens arrays are not reciprocated.
Figure 4B:
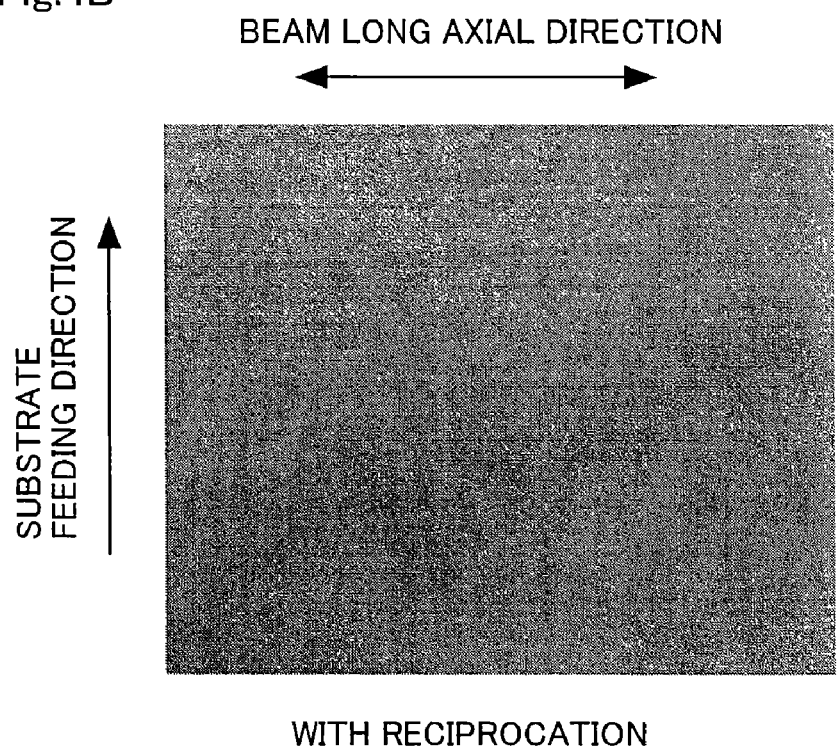
FIG. 4B is a photograph of a semiconductor film annealed by laser while the long-axis cylindrical lens arrays are reciprocated.

It is preferable that the frequency F of the reciprocation of the long-axis lens arrays 20a and 20b be 5 Hz or more. FIG. 4A is a photograph of a semiconductor film annealed by laser while the long-axis cylindrical lens arrays 20a and 20b are not reciprocated. FIG. 4B is a photograph of a semiconductor film annealed by laser while the long-axis cylindrical lens arrays 20a and 20b are reciprocated at a frequency of 7.5 Hz. It can be seen from FIG. 4B that if the frequency F is increased, horizontal stripes as well as the vertical stripes are reduced only by reciprocating the long-axis lens arrays 20a and 20b. The reason for this is guessed as follows: there is an action where the energy distribution of the laser beam 1, which enters a large-sized lens (projection lens 30) set on the rear side of optical system, in the short axial direction is changed due to the reciprocation of the long-axis lens arrays 20a and 20b. The action becomes significant by setting preferable conditions of the moving width S and the width W and increasing the frequency F, so that the horizontal stripes are also reduced.

Further, the polarization direction of the laser beam 1 may correspond to S polarization with respect to the surface of an amorphous semiconductor film 3. S polarization corresponds to the polarization direction perpendicular to the incidence plane (the surface of the amorphous semiconductor film 3 in the present invention), and P polarization corresponds to the polarization direction parallel to the incidence plane.

FIG. 5 is an SEM photograph of crystal grains when the amorphous semiconductor film is annealed by a P-polarized laser beam and when the amorphous semiconductor film is annealed by an S-polarized laser beam. When the amorphous semiconductor film is annealed by the S-polarized laser beam, a polycrystalline semiconductor film, which has uniform crystal grains having grain size larger (coarser) than crystal grains of a polycrystalline semiconductor film annealed by the P-polarized laser beam as shown in FIG. 5, is obtained. For this reason, it is possible to obtain an effect of reducing visible stripes.

If P polarization components are lesser, the effect of reducing visible stripes is more excellent. Accordingly, the irradiation of an S-polarized laser beam that is most preferable, the alternate irradiation of P- and S-polarized laser beams, the random polarization, and the irradiation of a P-polarized laser beam are preferable in this order. Further, from the standpoint of the influence of the polarization direction, it is preferable that a solid-state laser apparatus for generating a linearly polarized laser beam be used as the laser source 12. Meanwhile, as for second to fourth embodiments to be described below, it is also preferable that the polarization direction of the laser beam 1 correspond to S polarization.

As shown in FIG. 1B, the laser annealing apparatus 10 further includes a short-axis lens array moving apparatus 33 that reciprocates the short-axis lens arrays 26a and 26b in a direction corresponding to the short axial direction of the linear beam (Y-direction in FIG. 1A) during the laser irradiation. The short-axis lens array moving apparatus 33 is automatically controlled by a control device (not shown).

The incident angle and intensity of the laser beam 1 entering a large-sized lens (the projection lens 30 in this embodiment) of the short-axis condensing optical system, which is set on the rear side, are changed for every shot while the short-axis lens arrays 26a and 26b are reciprocated in the direction corresponding to the short axial direction of the linear beam as described above. Therefore, the uniformity of the beam in the short axial direction on the surface to be irradiated is changed for every shot, so that it is possible to obtain an effect of dispersing horizontal stripes on the surface to be irradiated that are caused by scattered light generated on the surface of the lens. As a result, the horizontal stripes are visually significantly reduced.

Meanwhile, as described above, the horizontal stripes as well as vertical stripes are reduced by reciprocating the long-axis lens arrays 20a and 20b. Accordingly, the laser annealing apparatus may have structure where the short-axis lens arrays 26a and 26b are not reciprocated and the only long-axis lens arrays 20a and 20b are reciprocated, and may reduce both vertical stripes and the horizontal stripes by using the structure.

In this embodiment, even though the lens arrays 20a, 20b, 26a, and 26b are reciprocated, the position of the beam radiated onto the surface to be irradiated is not changed.

Second Embodiment

Figure 6A:
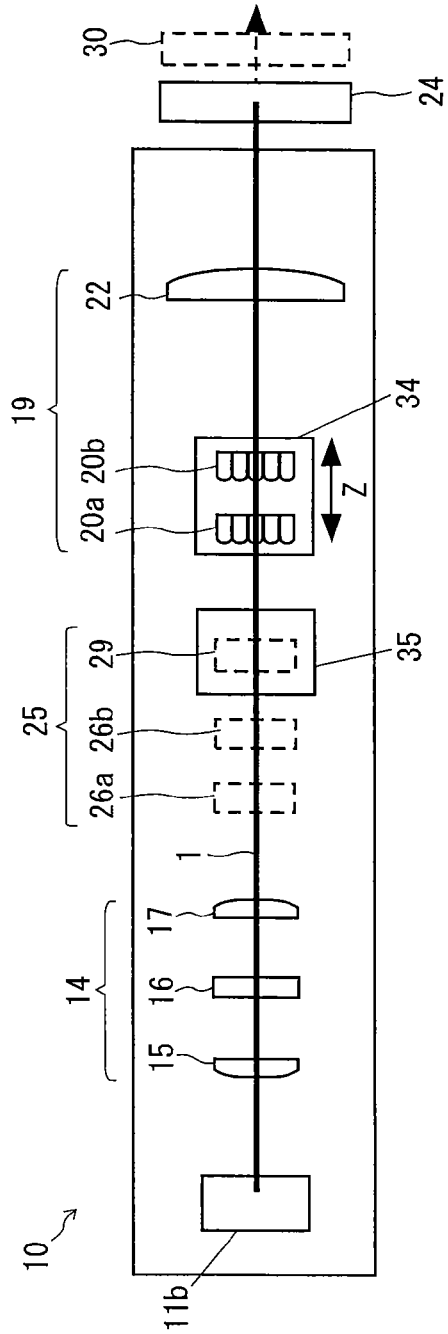
FIG. 6A is a view showing the schematic structure of a laser annealing apparatus according to a second embodiment of the present invention.
Figure 6B:
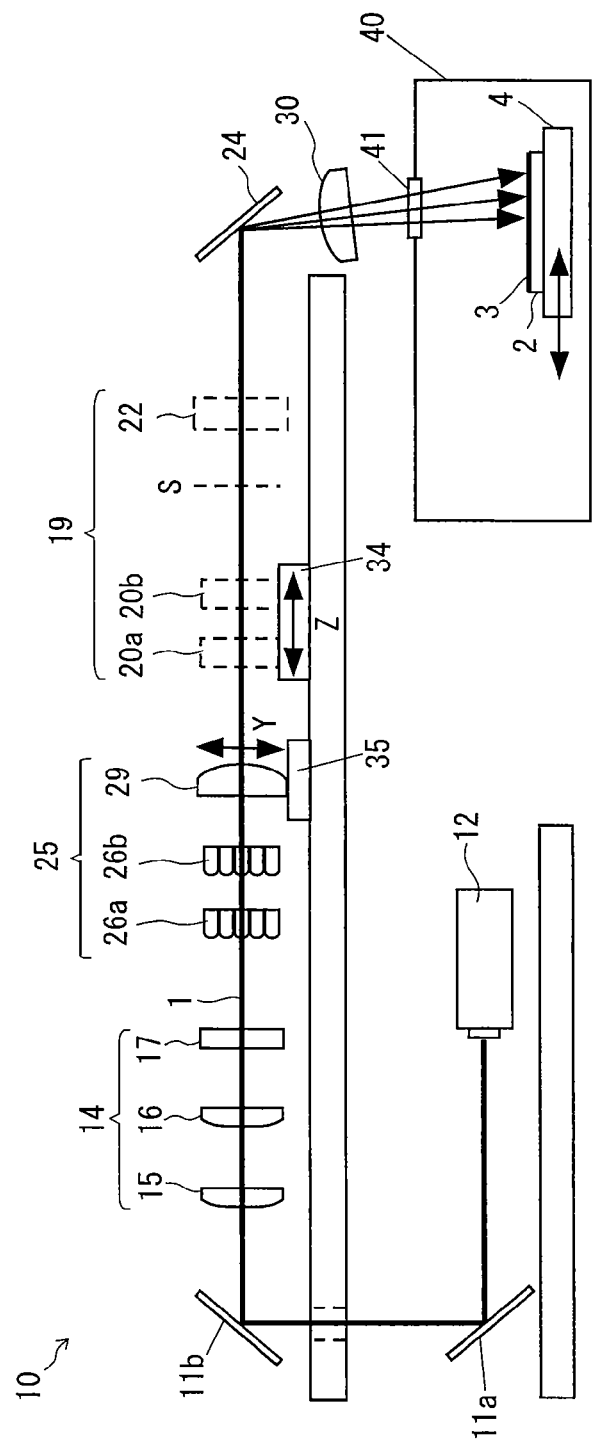
FIG. 6B is another view showing the schematic structure of the laser annealing apparatus according to the second embodiment of the present invention.

FIGS. 6A and 6B show the schematic structure of a laser annealing apparatus 10 according to a second embodiment of the present invention.

As shown in FIG. 6A, instead of the long-axis lens array moving apparatus 32 of the first embodiment, a laser annealing apparatus 10 according to this embodiment includes a long-axis lens array reciprocate apparatus 34, which reciprocates long-axis lens arrays 20a and 20b in an optical axis direction (Z-direction in FIG. 6A) during the laser irradiation, as a unit for increasing or decreasing relative distances on an optical path between a long-axis condensing optical system and long-axis lens arrays 20a and 20b while maintaining a distance on the optical path between the long-axis condensing optical system (a long-axis condenser lens 22 in this embodiment) and the surface of the object 3 to be irradiated constant. The long-axis lens array reciprocate apparatus 34 is automatically controlled by a control device (not shown).

The incident angle and intensity of the laser beam 1 entering a large-sized lens (the long-axis condenser lens 22) of the long-axis condensing optical system, which is set on the rear side, are changed for every shot while a distance on the optical path between the long-axis condensing optical system and the surface of the object 3 to be irradiated is maintained constant and the relative distances on the optical path between the long-axis condensing optical system and the long-axis lens arrays 20a and 20b are increased or decreased as described above. Therefore, it is possible to obtain an effect of dispersing vertical stripes on the surface to be irradiated that are caused by scattered light generated on the surface of the lens, so that the vertical stripes are significantly reduced. Further, as described in this embodiment, it is possible to easily increase or decrease the relative distances on the optical path between the long-axis condensing optical system and the long-axis lens arrays 20a and 20b by reciprocating the long-axis lens arrays 20a and 20b, which are formed in a small size, in the optical axis direction.

Furthermore, as shown in FIG. 6B, instead of the short-axis lens array moving apparatus of the first embodiment, the laser annealing apparatus 10 according to this embodiment includes a short-axis condenser lens moving apparatus 35 that reciprocates the short-axis lens in a direction corresponding to the short axial direction of the linear beam (Y-direction in FIG. 6B) during the laser irradiation. The short-axis condenser lens moving apparatus 35 is automatically controlled by a control device (not shown).

The incident angle and intensity of the laser beam 1 entering the projection lens 30, which is set on the rear side, are changed for every shot also while the short-axis condenser lens 29, which is set at the rear of the short-axis lens arrays 26a and 26b, is reciprocated in a direction corresponding to the short axial direction of the linear beam. Therefore, it is possible to obtain an effect of dispersing horizontal stripes on the surface to be irradiated that are caused by scattered light generated on the surface of the lens, so that the horizontal stripes are significantly reduced.

Other structure of this embodiment is the same as that of the first embodiment.

Third Embodiment

FIGS. 7A and 7B show the schematic structure of a laser annealing apparatus 10 according to a third embodiment of the present invention.

As shown in FIG. 7A, a long-axis homogenizer 19 of a laser annealing apparatus 10 according to this embodiment is composed of a waveguide type homogenizer using a waveguide 39. That is, the long-axis homogenizer 19 of this embodiment includes a long-axis waveguide 39, a long-axis introducing lens 38, and a long-axis optical system 23 used as a long-axis condensing optical system, which projects the edge face of waveguide 39 to the surface of the film. The long-axis waveguide divides a laser beam 1 into plural beams in a direction corresponding to the long axial direction of a linear beam. The long-axis focusing lens introduces the laser beam 1 into the long-axis waveguide 39. The long-axis condensing optical system makes the laser beam 1, which is divided into the plural beams by the long-axis waveguide 39, condense overlap each other on the surface of the object 3 to be irradiated. The long-axis optical system 23 of this embodiment is composed of two cylindrical lenses 23a and 23b. The long-axis optical system enlarges a long-axis image formed on the emitting surface of the long-axis waveguide 39 at a predetermined ratio, and then projects the image onto the surface to be irradiated.

As shown in FIG. 7A, the laser annealing apparatus 10 according to this embodiment includes a long-axis focusing lens moving apparatus 36, which reciprocates the long-axis focusing lens 38 in a direction corresponding to the long axial direction of the linear beam (X-direction in FIG. 7A) during the laser irradiation. The long-axis focusing lens moving apparatus 36 is automatically controlled by a control device (not shown).

The incident angle and intensity of the laser beam 1 entering large-sized lenses (the cylindrical lenses 23a and 23b in this embodiment) of the long-axis condensing optical system (the long-axis optical system 23 in this embodiment), which is set on the rear side, are changed for every shot while the long-axis focusing lens 38 is reciprocated in a direction corresponding to the long axial direction of the linear beam as described above. Therefore, it is possible to obtain an effect of dispersing vertical stripes on the surface to be irradiated that are caused by scattered light generated on the surface of the lens, so that the vertical stripes are significantly reduced.

As shown in FIG. 7B, instead of the short-axis lens array moving apparatus 33 of the first embodiment, the laser annealing apparatus 10 according to this embodiment includes a mirror tilting apparatus 37. The mirror tilting apparatus 37 tilts the reflecting mirror 11b during the laser irradiation so that a linear beam is reciprocated in the short axial direction. The mirror tilting apparatus 37 is automatically controlled by a control device (not shown).

The incident angle and intensity of the laser beam 1 entering large-sized lenses (the projection lens 30 and the cylindrical lenses 23a and 23b in this embodiment), which is set on the rear side, are changed for every shot by tilting the reflecting mirror 11a, which is provided on the optical path on the upstream side of the short-axis homogenizer 25 as described above. Accordingly, the linear beam is reciprocated in the short axial direction. Therefore, it is possible to obtain an effect of dispersing horizontal stripes on the surface to be irradiated that are caused by scattered light generated on the surface of the lens, so that the horizontal stripes are significantly reduced. In this case, the short-axis homogenizer 25 may be any one of a lens array type homogenizer and a waveguide type homogenizer. Further, as long as the reflecting mirror to be tilted is provided on the optical path on the upstream side of the short-axis homogenizer 25, any reflecting mirror may be used. Alternatively, the reflecting mirror 11a may be tilted instead of the reflecting mirror 11b.

Other structure of this embodiment is the same as that of the first embodiment.

Fourth Embodiment

FIGS. 8A and 8B show the schematic structure of a laser annealing apparatus 10 according to a fourth embodiment of the present invention.

As shown in FIG. 8B, a short-axis homogenizer 25 of a laser annealing apparatus 10 according to this embodiment is composed of a waveguide type homogenizer using a waveguide 44. That is, the short-axis homogenizer 25 of this embodiment includes a short-axis waveguide 44, a short-axis focusing lens 43, and a short-axis optical system (31a and 31b) used as a short-axis condensing optical system. The short-axis waveguide 44 divides a laser beam 1 into plural beams in a direction corresponding to the short axial direction of a linear beam. The short-axis focusing lens 43 introduces the laser beam 1 into the short-axis waveguide 44. The short-axis condensing optical system makes the laser beam 1, which is divided into plural beams by the short-axis waveguide 44, condense each other on the surface of the object 3 to be irradiated. The short-axis face optical system of this embodiment is composed of two cylindrical lenses 31a and 31b. The short-axis face optical system decreases a short-axis image formed on the emitting surface of the short-axis waveguide 44 at a predetermined ratio, and then projects the image onto the surface to be irradiated.

Further, as shown in FIG. 8B, the laser annealing apparatus 10 according to this embodiment includes a short-axis focusing lens moving apparatus 45 that reciprocates the short-axis focusing lens 43 in a direction corresponding to the short axial direction of the linear beam (Y-direction in FIG. 8B) during the laser irradiation.

The incident angle and intensity of the laser beam 1 entering large-sized lenses (the cylindrical lens 31b and the long-axis condenser lens 22 in this embodiment) of the short-axis condensing optical system, which is set on the rear side, are changed for every shot while the short-axis focusing lens 43 is reciprocated in a direction corresponding to the short axial direction of the linear beam as described above. Accordingly, it is possible to obtain an effect of dispersing horizontal stripes on the surface to be irradiated that are caused by scattered light generated on the surface of the lens, so that the horizontal stripes are significantly reduced.

Meanwhile, the combination of the structure for reducing the vertical stripes and the structure for reducing the horizontal stripes is not limited to the structure described in each embodiment. The structure for reducing the vertical stripes and the structure for reducing the horizontal stripes may be combined while being freely interchanged between the embodiments.

The embodiments of the present invention have been described above. However, the above-described embodiments are illustrative in all aspects, and the scope of the present invention is not limited to the embodiments of the present invention. The scope of the present invention is defined by the appended claims, and all changes and modifications that fall within meets and bounds of the claims, or equivalences of such meets and bounds are therefore intended to be embraced by the claims.

What is claimed is:

1. A laser annealing apparatus that shapes a laser beam generated by laser oscillation in order to condense the laser beam into a linear beam on a surface of an object to be irradiated, wherein the laser annealing apparatus relatively scans the object to be irradiated with the linear beam in a short axial direction of the linear beam so that the irradiation of the laser beam overlaps each other, and anneals the surface of the object to be irradiated by laser irradiation, wherein the laser annealing apparatus comprises:
   (a) a plurality of long-axis lens arrays that divide the laser beam into a plurality of first beams in a direction corresponding to a long axial direction of the linear beam;
   (b) a long-axis condensing optical system that makes the laser beam, wherein the laser beam is divided by the long-axis lens arrays, wherein the long-axis condensing optical system condenses the plurality of first beam in the long axial direction on the surface of the object to be irradiated; and
   (c) a long-axis lens array moving device that reciprocates the long-axis lens arrays in a direction corresponding to the long axial direction of the linear beam during the laser irradiation.

2. A laser annealing apparatus that shapes a laser beam generated by laser oscillation in order to condense the laser beam into a linear beam on a surface of an object to be irradiated, wherein the laser annealing apparatus relatively scans the object to be irradiated with the linear beam in a short axial direction of the linear beam so that the irradiation of the laser beam overlaps each other, and anneals the surface of the object to be irradiated by laser irradiation, wherein the laser annealing apparatus comprises:
   (a) a plurality of long-axis lens arrays that divide the laser beam into a plurality of first beams in a direction corresponding to a long axial direction of the linear beam;
   (b) a long-axis condensing optical system that makes the laser beam, wherein the laser beam is divided by the long-axis lens arrays, wherein the long-axis condensing optical system condenses the plurality of first beam in the long axial direction on the surface of the object to be irradiated; and
   (c) a long-axis lens array moving device that reciprocates the long-axis lens arrays in a direction corresponding to the long axial direction of the linear beam during laser irradiation,
   wherein a polarization direction of the laser beam corresponds to S polarization with respect to the surface of the object to be irradiated.

3. A laser annealing apparatus that shapes a laser beam generated by laser oscillation in order to condense the laser beam into a linear beam on a surface of an object to be irradiated, wherein the laser annealing apparatus relatively scans the object to be irradiated with the linear beam in a short axial direction of the linear beam so that the irradiation of the laser beam overlaps each other, and anneals the surface of the object to be irradiated by laser irradiation, wherein the laser annealing apparatus comprises:
   (a) a plurality of long-axis lens arrays that divide the laser beam into a plurality of first beams in a direction corresponding to a long axial direction of the linear beam;
   (b) a long-axis condensing optical system that makes the laser beam, wherein the laser beam is divided by the long-axis lens arrays, wherein the long-axis condensing optical system condenses the plurality of first beam in the long axial direction on the surface of the object to be irradiated; and
   (c) a long-axis lens array moving device that reciprocates the long-axis lens arrays in a direction corresponding to the long axial direction of the linear beam during laser irradiation,
   wherein when a moving width of the reciprocation of each of the long-axis lens arrays is represented by S and a width of each cylindrical lens of the long-axis lens arrays is represented by W, a relationship of "1.0 mmS$\leq$W", "1.5 mmS$\leq$W", or "3.0 mmS$\leq$W" is satisfied.

4. The laser annealing apparatus according to claim 3, wherein a polarization direction of the laser beam corresponds to S polarization with respect to the surface of the object to be irradiated.

5. A laser annealing apparatus that shapes a laser beam generated by laser oscillation in order to condense the laser beam into a linear beam on a surface of an object to be irradiated, wherein the laser annealing apparatus relatively scans the object to be irradiated with the linear beam in a short axial direction of the linear beam so that the irradiation of the laser beam overlaps each other, and anneals the surface of the object to be irradiated by laser irradiation, wherein the laser annealing apparatus comprises:
   (a) a plurality of long-axis lens arrays that divide the laser beam into a plurality of first beams in a direction corresponding to a long axial direction of the linear beam;

(b) a long-axis condensing optical system that makes the laser beam, wherein the laser beam is divided by the long-axis lens arrays, wherein the long-axis condensing optical system condenses the plurality of first beam in the long axial direction on the surface of the object to be irradiated; and (c) a long-axis lens array moving device that reciprocates the long-axis lens arrays in a direction corresponding to the long axial direction of the linear beam during laser irradiation, wherein when a moving width of the reciprocation of each of the long-axis lens arrays is represented by S; a pitch of stripes, which are parallel to a scanning direction of the linear beam and appear visually when laser annealing is performed without reciprocating the long-axis lens arrays, is represented by P; and a width of each cylindrical lens of the long-axis lens arrays is represented by W, a relationship of "$P/3 \leqq S < W$", "$P/2 \leqq S < W$", or "$P \leqq S < W$" is satisfied.

6. The laser annealing apparatus according to claim 5, wherein a polarization direction of the laser beam corresponds to S polarization with respect to the surface of the object to be irradiated.

* * * * *